United States Patent
Kim et al.

(10) Patent No.: US 9,760,125 B2
(45) Date of Patent: Sep. 12, 2017

(54) NARROW BEZEL DISPLAY APPARATUS USING A FOLDED SUBSTRATE

(71) Applicant: LG DISPLAY CO., LTD., Seoul (KR)

(72) Inventors: JaeBok Kim, Gumi-si (KR); ChangHoon Jeon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 131 days.

(21) Appl. No.: 14/251,244

(22) Filed: Apr. 11, 2014

(65) Prior Publication Data

US 2014/0306941 A1 Oct. 16, 2014

(30) Foreign Application Priority Data

Apr. 11, 2013 (KR) .......................... 10-2013-0040072

(51) Int. Cl.
*G06F 1/16* (2006.01)
*H04M 1/02* (2006.01)

(52) U.S. Cl.
CPC ........ *G06F 1/1652* (2013.01); *H04M 1/0268* (2013.01)

(58) Field of Classification Search
CPC  G06F 1/1652; H04M 1/0268; H01L 27/3276; G02F 1/13452
See application file for complete search history.

(56) References Cited

U.S. PATENT DOCUMENTS

| 7,348,492 B1* | 3/2008 | Kawai | G02F 1/13452 174/254 |
| 2008/0012474 A1 | 1/2008 | Sung et al. | |
| 2011/0007042 A1 | 1/2011 | Miyaguchi | |
| 2012/0146886 A1* | 6/2012 | Minami | H01L 27/3276 345/80 |
| 2013/0126874 A1* | 5/2013 | Jung | H01L 51/5243 257/59 |
| 2013/0319841 A1* | 12/2013 | Chao | H03K 17/962 200/600 |
| 2014/0097408 A1* | 4/2014 | Kim | H01L 27/3237 257/40 |

FOREIGN PATENT DOCUMENTS

| CN | 1622715 A | 6/2005 |
| CN | 1728900 A | 2/2006 |
| CN | 1734542 A | 2/2006 |
| CN | 1992264 A | 7/2007 |

* cited by examiner

*Primary Examiner* — Chanh Nguyen
*Assistant Examiner* — Sepehr Azari
(74) *Attorney, Agent, or Firm* — Birch, Stewart, Kolasch & Birch, LLP

(57) ABSTRACT

The present invention relates to a flexible display panel for suppressing a problem in which a crack such as disconnection on an internal circuit layer or the like is generated or a required warpage level is not attainable in a warped area while bending an edge portion thereof. According to an embodiment of the present invention, the layer structure of a signal line portion for electrically connecting elements provided within a display area and a non-active area may be simplified, and a protective member may be formed thereon, thereby obtaining the effect of minimizing the damage of the layer structure due to bending.

15 Claims, 7 Drawing Sheets

NARROW BEZEL DISPLAY APPARATUS USING A FOLDED SUBSTRATE

CROSS-REFERENCE TO RELATED APPLICATIONS

This application claims the benefit of Korean Patent Application No. 10-2013-0040072, filed on Apr. 11, 2013 in Republic of Korea, which is hereby incorporated by reference for all purposes as if fully set forth herein.

BACKGROUND OF THE INVENTION

Field of the Invention

The present invention relates to a flexible display panel, and more particularly, to a flexible display panel for suppressing a problem in which a crack such as disconnection on an internal circuit layer or the like is generated or a required warpage level is not attainable in a warped area while bending an edge portion thereof.

Description of the Related Art

In recent years, while interest in information displays has risen and demand for using portable information media has increased, studies on flat panel display devices (FPDs) for replacing the existing display devices such as cathode ray tubes and commercialization thereof have been mostly carried out.

In such a flat panel display field, though liquid lightweight and low-power liquid crystal display devices have been most noteworthy flat panel display devices up to now, development on new flat panel displays has been actively carried out according to various requirements.

Since organic light emitting diode (OLED) display devices, which are one of new flat panel displays, are a spontaneous light-emitting type, they have excellent viewing angle and contrast range characteristics but do not require a backlight contrary to liquid crystal displays, and thus allowing a lightweight and low profile device as well as being beneficial in the aspect of power consumption. Furthermore, they have an advantage in low DC voltage drive and high response speed, and also particularly have a beneficial advantage in the aspect of fabrication cost.

In particular, flexible display devices, which are not likely to be damaged even when folded or rolled up, will be emerged as a new technology in the flat panel display device field, and organic light emitting display devices in which pixel formation is easily made on a flexible plastic substrate are more suitable than liquid crystal displays, mostly using a glass substrate, in implementing a flexible display device with the development of technology.

FIG. 1 is a view schematically illustrating a flexible display panel with a plastic material substrate used in a flexible display device according to the related art.

Referring to FIG. 1, a flexible display device 1 is formed with an active area (A/A) in which an actual image is implemented on a plastic substrate 10 and a non-active area (N/A) surrounding the active area (A/A). Though not shown in the drawing, a pixel area defined by a plurality of gate lines and data lines is formed in the active area (A/A), a plurality of thin film transistor are formed in the pixel area.

Furthermore, two gate driving circuits 30 are embedded therein in a gate-in-panel (GIP) structure at the left and right side ends of the non-active area (N/A) of the flexible display device 1. The gate driving circuit 30 supplies a gate signal to each pixel through a signal line connected to a gate line in the active area (A/A). Furthermore, a data driving circuit 40 connected to a data line on the active area (A/A) is provided at one side of the non-active area (N/A). The data driving circuit 40 is electrically connected to a pad 46 formed at one side end of the flexible display panel 1. In addition, a polarizing film 60 for compensating the optical characteristics of the flexible display panel 1 is adhered onto a front surface of the active area (A/A).

In implementing a display device using a flexible display panel with the foregoing structure, there is proposed a structure in which a narrow bezel is implemented by bending at least one side end thereof.

FIG. 2 is a view for explaining the bending structure of a narrow bezel structured flexible display panel according to the related art.

Referring to FIG. 2, the flexible display device 1 defined by an active area (A/A) formed with a plurality of pixels and a non-active area (N/A) surrounding the active area (A/A) is configured with a form in which a plastic substrate 10 configured with a polyimide or the like, a driving element layer 20 including various signal lines and a plurality of thin film transistors formed on the substrate 10, a light-emitting element layer 25 formed on the driving element layer 20 to implement an image, a barrier film 40 configured to protect the driving element layer 20 and light-emitting element layer 25 thereunder, and a polarizing film 60 configured to compensate optical characteristics are layered thereon. Furthermore, a supporting film 70 with a polyethylene terephthalate (PET) material for supporting the flexible display panel 1 is further adhered to a lower portion of the substrate 10. Here, the non-active area (N/A) is not an area for displaying an image, and thus is configured not to include the light-emitting element layer 25, barrier film 40, and polarizing film 60, but configured to include a predetermined signal line and thin film transistor constituting a gate driving circuit in a GIP manner.

In order to implement a narrow bezel in a flexible display device with the foregoing structure, it is configured such that the non-active area (N/A) is warped in the rear surface direction of the display panel 1. Here, metals constituting the signal lines and thin film transistors contained in the driving element layer 20 are formed of titanium/aluminum/titanium (Ti/Al/Ti) in case of source/drain electrodes, and formed of molybdenum niobium/aluminum (MoNb/Al) in case of a gate electrode, and a crack is often generated according to a force acting on the driving element layer 20 during the bending process.

Furthermore, the supporting film 70 adhered to a lower portion of the plastic substrate 10 has a characteristic of not being easily warped compared to the plastic substrate 10, thereby causing a problem in which the bending structure cannot be maintained as it is during the module process of the display device.

SUMMARY OF THE INVENTION

The present invention is contrived to solve or address the foregoing problems, and an object of the present invention is to provide a flexible display device for warping each side end of the flexible display panel using a plastic substrate to implement a narrow bezel structure as well as minimizing the damage of the signal line, thin film transistor, and the like in a warped area.

In order to accomplish the foregoing objects, a flexible display panel according to an embodiment of the present invention may include an active area provided with a plurality of pixel having a multi-layer structure; a non-active area configured to surround the active area, and provided with a gate driving circuit having a multi-layer structure; and a substrate defined with a bending area formed between the gate driving circuit and the active area, and at least one lateral surface of which is warped in a rear surface direction thereof, wherein the bending area comprises an auxiliary line formed with one layer for electrically connecting the gate driving circuit to the pixel.

Furthermore, in order to accomplish the foregoing objects, a flexible display panel according to an embodiment of the present invention may include a substrate defined with an active area and a non-active area comprising a GIP area and a bending area, and the bending area of which is warped in a rear surface direction thereof; a driving element layer formed on the active area and GIP area, respectively, to comprise a thin film transistor connected to the gate line and data line; an auxiliary line formed on the bending area to be electrically connected to the driving element layer; a light-emitting element layer formed to be divided into each pixel on the driving element layer; a first passivation layer formed on the light-emitting element layer; an organic layer formed on the first passivation layer; and a second passivation layer formed on the first passivation layer of the active area, to an upper portion of which a protective film is adhered by an adhesive.

According to a flexible display device in accordance with an embodiment of the present invention, the layer structure of a signal line portion for electrically connecting elements provided within an active area and a non-active area may be simplified, and a protective member may be formed thereon, thereby obtaining the effect of minimizing the damage of the layer structure due to bending.

BRIEF DESCRIPTION OF THE DRAWINGS

The accompanying drawings, which are included to provide a further understanding of the invention, and are incorporated in and constitute a part of this specification, illustrate embodiments of the invention and together with the description serve to explain the principles of the invention.

In the drawings.

DETAILED DESCRIPTION OF THE INVENTION

Hereinafter, a flexible display device according to preferred embodiments of the present invention and a fabrication method thereof will be described with reference to the accompanying drawings.

Figure 1:
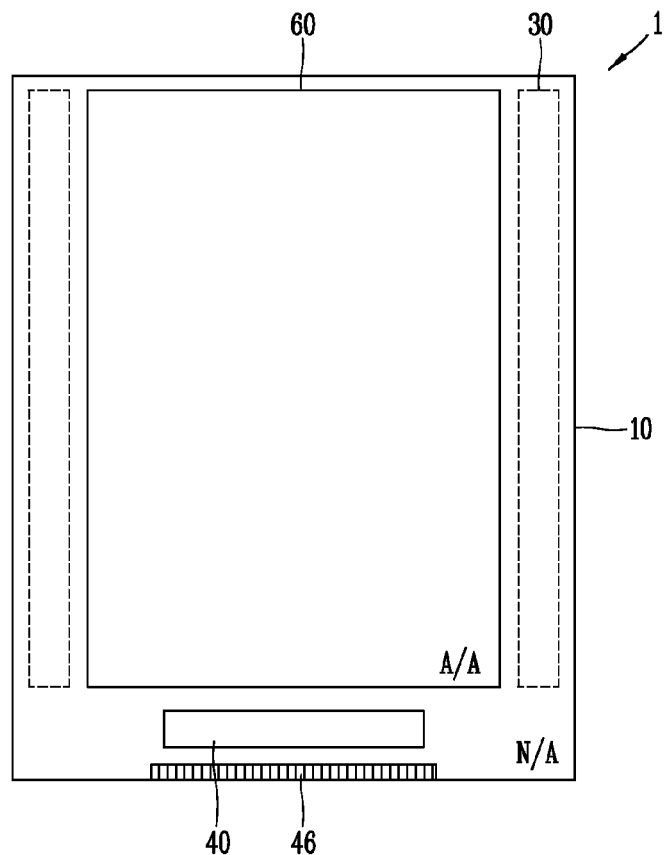
FIG. 1 is a view schematically illustrating a flexible display panel with a plastic material substrate used in a flexible display device according to the related art.
Figure 2:
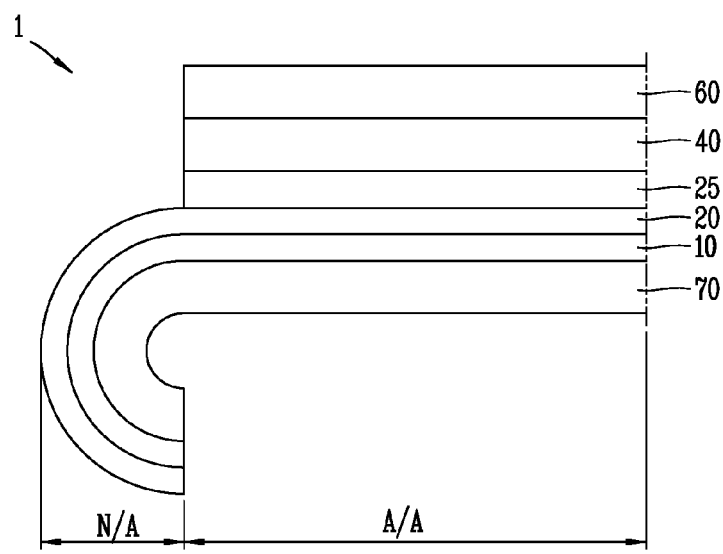
FIG. 2 is a view for explaining the bending structure of a narrow bezel structured flexible display panel according to the related art.
Figure 3:
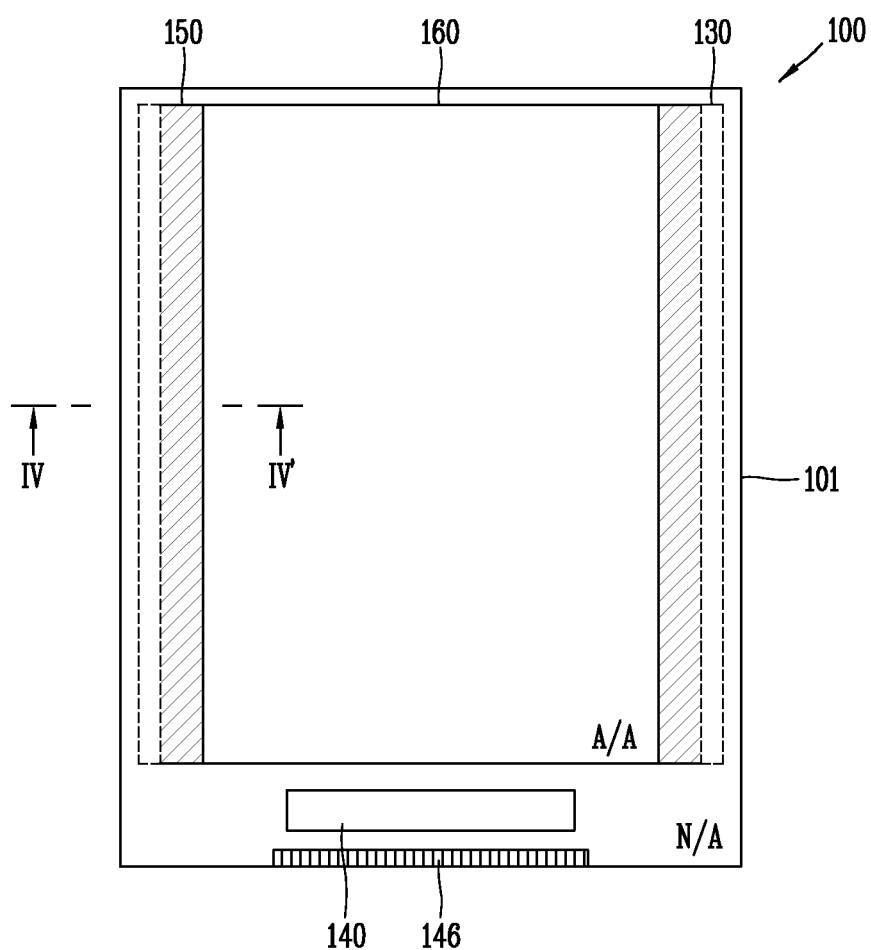
FIG. 3 is a view illustrating the structure of a flexible display panel according to an embodiment of the present invention.

FIG. 3 is a view illustrating the structure of a flexible display panel according to an embodiment of the present invention.

Referring to FIG. 3, a flexible display panel 100 according to the present invention is defined with an active area (A/A) configured to display an image on a plastic material substrate 101 having flexibility, and a non-active area (N/A) surrounding the outside of the active area (A/A).

The active area (A/A) of the flexible display panel 100 is formed with a plurality of pixels (PXs) defined by a plurality of gate lines (not shown) and data lines (not shown) to include at least one thin film transistor. Furthermore, a plurality of power lines (not shown) is formed in parallel to a data line (not shown), and such various signal lines and thin film transistors may form a driving element layer (not shown) on the substrate. A polarizing film 160 for compensating the optical characteristics of the flexible display panel 100 is adhered onto the uppermost layer of the active area (A/A).

In addition, a gate driving circuit 130 electrically connected to the gate line of the active area (A/A) to provide a gate driving signal is mounted in a GIP manner on the non-active area (N/A) at both side ends of the flexible display panel 100.

Furthermore, a data driving circuit 140 providing a data signal is mounted in a COG manner on the non-active area (N/A) at one side end of the flexible display panel 100. The data driving circuit 140 is electrically connected to an external system through a pad 146 formed on the substrate 101.

In particular, the flexible display panel 100 according to the present invention is characterized in that an additional signal line is formed between the gate driving circuit 130 within the non-active area (N/A) and the active area (A/A) to be electrically connected to each other, and a protective layer 150 is formed thereon to minimize the damage of an organic layer, an inorganic layer and other signal lines during the bending of the flexible display panel 100.

In other words, a protective layer 150 is further formed in such a manner that an additional signal line (not shown) is formed on the substrate 101 to substitute a layer structure formed between the conventional active area (A/A) and gate driving circuit 130 to simplify the layer structure and minimize a force applied to the signal line (not shown) according to the substrate 101 being warped in the upward direction.

Hereinafter, the structure of a flexible display panel according to an embodiment of the present invention will be described in more detail with reference to one cross section of the display panel 100.

Figure 4:
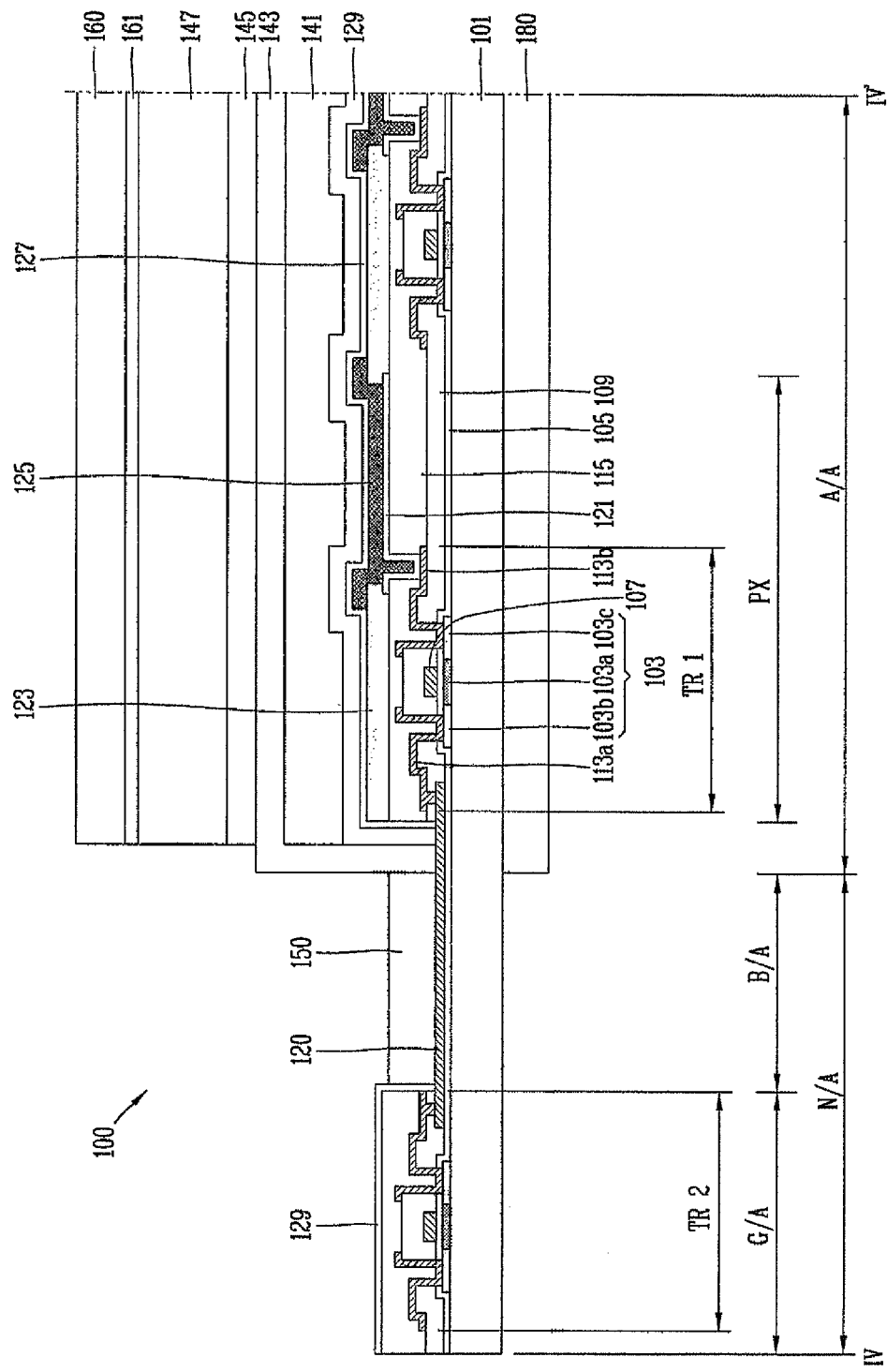
FIG. 4 is a cross-sectional view illustrating a portion taken along line IV-IV' in FIG. 3.

FIG. 4 is a cross-sectional view illustrating a portion taken along line IV-IV' in FIG. 3.

As illustrated in the drawing, the display panel 100 according to an embodiment of the present invention is divided to an active area (A/A) configured to display an image and a non-active area (N/A) configured to surround the outside of the active area (A/A).

Each pixel (PX) within the display area (A/A) may include an organic light emitting diode, and at least one switching thin film transistor and driving thin film transistor for controlling the organic light emitting diode.

Furthermore, a barrier film 147 is positioned in a facing manner for the encapsulation of the pixel (PX) on an entire surface of the substrate, and a polarizing film 160 is adhered to an upper portion of the barrier film 147. The polarizing film 160 performs the role of preventing image quality from being deteriorated by the reflection of light incident from the outside to the organic light emitting display device.

A bending area (B/A) is further defined between a GIP area (G/A) including a gate driving circuit on the non-active area (N/A) and the active area (A/A), and an auxiliary line 120 for electrically connecting the GIP area (G/A) to the active area (A/A) and a protective layer 150 for preventing the damage of the auxiliary line 120 due to bending are further formed on the bending area (B/A).

Here, a material capable of minimizing a force applied to the auxiliary line 120 as each side end thereof is bent is used for the protective layer 150, and here, the thickness and Young's modulus of the auxiliary line 120 and substrate 101 may be taken into consideration.

Referring to FIG. 4, a buffer layer (not shown) made of an insulating material, particularly, silicon oxide ($SiO_2$) or silicon nitride (SiNx), which is an inorganic insulating material, may be formed on the substrate 101. The buffer layer (not shown) is formed to minimize the characteristic deterioration problem of the semiconductor layer 103 due to the emission of alkali ions taken out of the inside of the substrate 101 during the crystallization process of the semiconductor layer 103 which is a subsequent process, and thus can be omitted.

Furthermore, at least one switching thin film transistor (not shown) and driving thin film transistor (TR1) for controlling an organic light emitting diode is provided at each pixel (PX) within the display area (A/A) on the buffer layer (not shown). Here, a driving thin film transistor (TR1) in pixel is formed along with a GIP thin film transistor (TR2) on the GIP area (G/A).

Furthermore, a semiconductor layer 103 configured with a first region 103a made of pure polysilicon to form a channel at a central portion thereof, and second regions 103b, 103c into which high concentration impurities are doped at both sides of the first region 103a are formed to correspond to each thin film transistor (TR1, TR2).

A gate insulating layer 105 is formed on the buffer layer including the semiconductor layer 103.

In addition, a gate electrode 107 is formed to correspond to the first region 103a of the semiconductor layer 103 in each thin film transistor (TR1, TR2) on the gate insulating layer 105.

Furthermore, a gate line (not shown) connected to the gate electrode 107 of the switching thin film transistor (not shown) and extended in one direction is formed on the same layer as that of the gate electrode 107. Here, the gate electrode 107 and the gate line may be formed with a single layer structure made of a first metal material, for example, any one of aluminum (Al), aluminum alloy (AlNd), molybdenum (Mo) and molybdenum titanium (MoTi) or formed with a double or triple layer structure made of two or more first metal materials.

In addition, the auxiliary line 120 is further formed around the bending area (B/A) during the formation of the gate electrode 107 and gate line. The auxiliary line 120 is extended to the active area (A/A) and non-active area (N/A) to electrically connect the driving thin film transistor (TR1) to the GIP thin film transistor (TR2). On the drawing, it is illustrated an example in which the auxiliary line 120 connects the source of the driving thin film transistor (TR1) to the drain of the GIP thin film transistor (TR2), but the detailed connecting structure may be different from the drawing according to the circuit structure.

Furthermore, on the drawing, it is illustrated an example in which the auxiliary line 120 is formed through the same metal as that of the gate line and gate electrode 107, but the auxiliary line 120 may be formed using the source/drain metal which will be described later other than the gate metal.

Moreover, the auxiliary line 120 may be formed using an additional metal having flexibility other than the gate metal or source/drain metal. The auxiliary line 120 is a portion being warped during the bending of the flexible display panel 100, and thus a metal with a flexible material may be used, rather than typically used gate metals or source/drain metals to minimize damage. Accordingly, when the auxiliary line 120 is formed using a flexible copper (Cu) or copper alloy other than the foregoing metal, it may be possible to reduce a rate of damage due to bending.

In addition, an interlayer insulating layer 109 made of an insulating material, for example, silicon oxide ($SiO_2$) or silicon nitride (SiNx), which is an inorganic insulating layer, is formed on an entire surface of the active area of the substrate including the gate electrode 107 and gate line. Here, a semiconductor layer contact hole (not shown) for exposing the second regions 103b, 103c, respectively, positioned at both sides of the first region 103a of each semiconductor layer 103 is formed on the interlayer insulating layer 109 and the gate insulating layer 105 thereunder.

A data line crossed with a scan line to define a pixel (PX) is formed on the interlayer insulating layer 109 including the semiconductor layer contact hole. Here, the data line and power supply line may be any one of aluminum (Al), aluminum alloy (AlNd), molybdenum (Mo), molybdenum titanium (MoTi), chromium (Cr) and titanium (Ti) or a combination of two or more thereof.

In addition, a source electrode 113a and a drain electrode 113b brought into contact with the second regions 103b, 103c, respectively, exposed through the semiconductor layer contact hole (not shown) and made of a second metal material as that of the data line are formed in each transistor region on the interlayer insulating layer 109. Here, the sequentially layered semiconductor layer 103, gate insulating layer 105 and the gate electrode 107 and interlayer insulating layer 109 and the source electrode 113a and drain electrode 113b formed to be separated from each other form a driving thin film transistor (TR1), and a GIP thin film transistor (TR2) formed on the GIP area (G/A) is formed with the same structure.

In particular, though it is illustrated an example in the drawing that each thin film transistor (TR1, TR2) has a polysilicon semiconductor layer 103 with a top gate type, a bottom gate type may be also applicable to the driving thin film transistor (TR1).

When the thin film transistors (TR1, TR2) are configured with a bottom gate type, the layer structure may include a semiconductor layer separated from an active layer with a gate electrode/a gate insulating layer/with pure amorphous silicon and made of an ohmic contact layer with impurity amorphous silicon, and a source electrode and a drain electrode separated from each other.

Furthermore, a planarization layer 115 having a drain contact hole (not shown) for exposing the drain electrode 113b is layered on the driving thin film transistor (TR1). Either one of an insulating material, for example, silicon oxide ($SiO_2$) or silicon nitride (SiNx) which is an inorganic insulating material, or an organic insulating material including photo acryl may be used for the planarization layer 115.

In addition, a first electrode 121 brought into contact with the drain electrode 113c of the driving thin film transistor (TR1) through the drain contact hole (not shown) to have a separated shape for each pixel (PX) may be formed on the planarization layer 115.

In addition, a bank 123 made of an insulating material, particularly, benzo-cyclo-butene (BCB), polyimide or photo acryl, is formed on the first electrode 121 up to the boundary of each pixel (PX) and non-active area (N/A). The bank 123 is formed in a shape surrounding each pixel (PX) to be overlapped with an edge of the first electrode 121, and formed in a lattice shape having a plurality of opening portions as a whole on the active area (A/A).

An organic light emitting layer 125 configured with an organic light emitting pattern (not shown) that emits red, green and blue colors, respectively, on the first electrode 121 within each pixel (PX) surrounded by the bank 123. The organic light emitting layer 125 may be configured with a single layer made of an organic light emitting material or configured with a multi-layer having a hole injection layer, a hole transporting layer, an emitting material layer, an electron transporting layer, and an electron injection layer.

A second electrode 127 is formed on an entire surface of the active area (A/A) on the organic light emitting layer 125 and bank 123. Here, the first electrode 121 and second electrode 127 and an organic light emitting layer 125 interposed therebetween constitute one organic light emitting diode.

In describing the operation of an organic light emitting diode having the foregoing structure, as a predetermined gradation value reflected voltage is applied to the first electrode 121 and second electrode 127, a hole injected from the first electrode 121 and an electron provided from the second electrode 127 are transported to the organic light emitting layer 125 to form an exciton. When an excited state returns to a ground state, the exciton emits light as luminous energy, and the emitted light exits to the outside through the transparent second electrode 127, and thus the flexible display panel 100 implements an arbitrary image.

On the other hand, a first passivation layer 129 made of an insulating material, particularly, silicon oxide ($SiO_2$) or silicon nitride ($SiN_x$), which is an inorganic insulating material, is formed on the active area (A/A) of the substrate including the second electrode 127. The first passivation layer 129 is formed since moisture infiltration into the organic light emitting layer 125 cannot be blocked only with the second electrode 127, and thus the first passivation layer 129 performing a protective role is formed on the second electrode 127 to minimize moisture infiltration into the organic light emitting layer 125.

Furthermore, the GIP thin film transistor (TR2) on the GIP area (G/A) has a similar layer structure to that of the driving thin film transistor (TR1) on the active area (A/A) from the semiconductor layer 103 to the first passivation layer 129, but has a structure in which the first and the second electrode 121, 127 and organic light emitting layer 125 are omitted.

On the contrary, the bending area (B/A) has a difference in that the gate insulating layer 105, interlayer insulating layer 109, planarization layer 115 and the like excluding the auxiliary line 120 as well as the foregoing thin film transistors (TR1, TR2) are not formed thereon.

On the other hand, an organic layer 141 made of a polymeric organic material such as a polymer is formed on the first passivation layer 129 of the active area (A/A). Here, an olefin-based polymer (polyethylene, polypropylene), polyethylene terephthalate (PET), epoxy resin, fluororesin, polysiloxane, and the like may be used for a polymer layer constituting an organic layer 131.

Furthermore, in order to block moisture from being infiltrated through the organic layer 141, a second passivation layer 143 made of an insulating material, for example, silicon oxide ($SiO_2$) or silicon nitride ($SiN_x$), which is an inorganic insulating material, is formed on the active area (A/A) including the organic layer 141.

In addition, a barrier film 147 is positioned in a facing manner for the encapsulation of the organic light emitting diode on an entire surface of the substrate including the second passivation layer 143, and an adhesive 145 made of any one of a frit, an organic insulating material, and a polymeric material having transparent and adhesive characteristics is completely adhered to the substrate 101 and barrier film 147 with no air layer between the second passivation layer 143 and barrier film 147.

A polarizing film 160 is adhered to an upper portion of the barrier film 147. The polarizing film 160 is completely closely adhered to the barrier film 147 with no gap to perform the role of preventing image quality from being deteriorated by the reflection of light incident from the outside to the organic light emitting display device.

On the other hand, a protective layer 150 is formed on the auxiliary line 120 over the bending area (B/A). The protective layer 150 is provided to minimize the damage of the auxiliary line 120 due to the bending of the flexible display panel 100 as well as perform the role of preventing moisture infiltration, and a material having flexible characteristics is used for the protective layer 150.

In particular, when the bending area (B/A) is warped and the GIP area (G/A) is positioned on a rear surface of the flexible display panel 100 according to a narrow bezel structure, the protective layer 150 performs the role of minimizing an attractive force or tension applied to the protective layer 150 in consideration of the thickness and Young's modulus. To this end, the protective layer 150 may be formed of the same material with the same thickness as that of the substrate 101.

The protective layer 150 is formed to expose the auxiliary line 120 during the deposition of the foregoing gate insulating layer 105, interlayer insulating layer 109, planarization layer 115 and the like subsequent to the formation of the auxiliary line 120, and formed prior to the adhesion of the barrier film 147 or polarizing film 160.

On the other hand, the flexible display panel 100 is warped in a gravitational direction due to the flexibility of the substrate 101 during the fabrication process of the display device, and thus has a disadvantage of being difficult to be applicable to the process. In the prior art, in order to solve the foregoing problem, a polyethylene terephthalate (PET) film is adhered over the entire rear surface area of the flexible display panel 100 to facilitate the fabrication process of the display device, but it also acts as a factor of disturbing the bending process. Accordingly, according to an embodiment of the present invention, the PET film 190 is adhered only to a portion corresponding to the active area (A/A) on a rear surface of the flexible display panel 100.

Hereinafter, an assembled form according to the bending structure of a flexible display panel according to an embodiment of the present invention will be described with reference to the accompanying drawings.

Figure 5A:
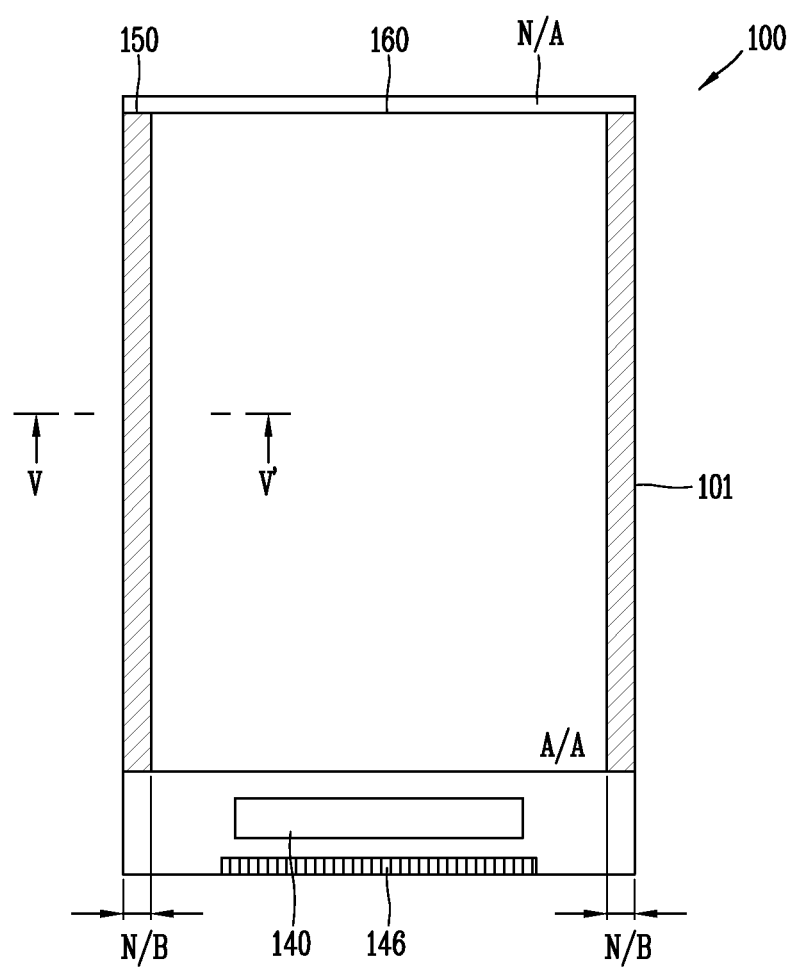
FIG. 5A is a view illustrating an example in which a flexible display panel according to an embodiment of the present invention is fixed in a bending structure.
Figure 5B:
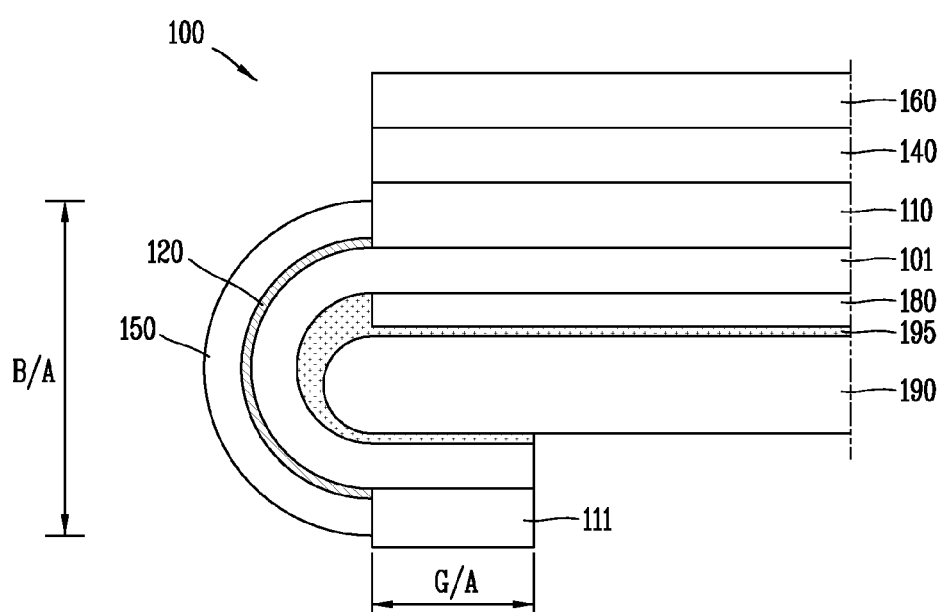
FIG. 5B is a view illustrating the cross section of a portion taken along line V-V' in FIG. 5A.

FIG. 5A is a view illustrating an example in which a flexible display panel according to an embodiment of the present invention is fixed in a bending structure, and FIG. 5B is a view illustrating the cross section of a portion taken along line V-V' in FIG. 5A.

As illustrated in FIGS. 5A and 5B, in a flexible display panel 100 according to the present invention, a pixel circuit layer 110 including a plurality of signal lines and transistors is formed in the active area (A/A) on the plastic substrate 101, and a GIP circuit layer 111 including a gate driving circuit is formed on the non-active area (N/A) in a similar structure to that of the pixel circuit layer 110. A PET film 180 for preventing the substrate 101 from being warped during the fabrication process is adhered to the active area (A/A) on a rear surface of the substrate 101. Furthermore, a barrier film 140 for protecting the pixel circuit layer 110 and a polarizing film 160 for compensating optical characteristics are adhered to an upper portion of the pixel circuit layer 110.

The pixel circuit layer 110 may further include an organic light emitting layer for displaying an image as well as a thin film transistor contrary to the GIP circuit layer 111.

The substrate 101 is adhered to a mechanical structure 190 on a rear surface thereof through a predetermined adhesive 195, and a side end of the mechanical structure 190 may have a circular structure such that a side end of the substrate 101 is warped while forming a predetermined radius.

Furthermore, the bending area (B/A) being warped in a rear surface direction as the substrate 101 is adhered onto the mechanical structure 190 excluding the GIP area (G/A) is defined on the non-active area (N/A), and the auxiliary line 120 for electrically connecting the pixel circuit layer 110 to GIP circuit layer 111 is formed on the bending area (B/A). Furthermore, the protective layer 150 for minimizing a force acting on the auxiliary line 120 according to the warpage as well as preventing the auxiliary line 120 from being exposed to the outside to be damaged is formed on the auxiliary line 120. Here, the thickness and material quality of the protective layer 150 are determined by the substrate 101 and auxiliary line 120.

Accordingly, in the flexible display panel 100 mounted on the mechanical structure 190, the gate driving circuit is positioned on a rear surface of the mechanical structure 190 and the width of both the left and right bezel portions thereof is reduced when viewed from the front surface, thereby implementing a narrow bezel (N/B).

On the other hand, the foregoing embodiment has a structure in which only both the left and right bezel portions of the flexible display panel 100 are bent, and a flexible display panel according to another embodiment of the present invention will be described with reference to the accompanying drawings.

Figure 6A:
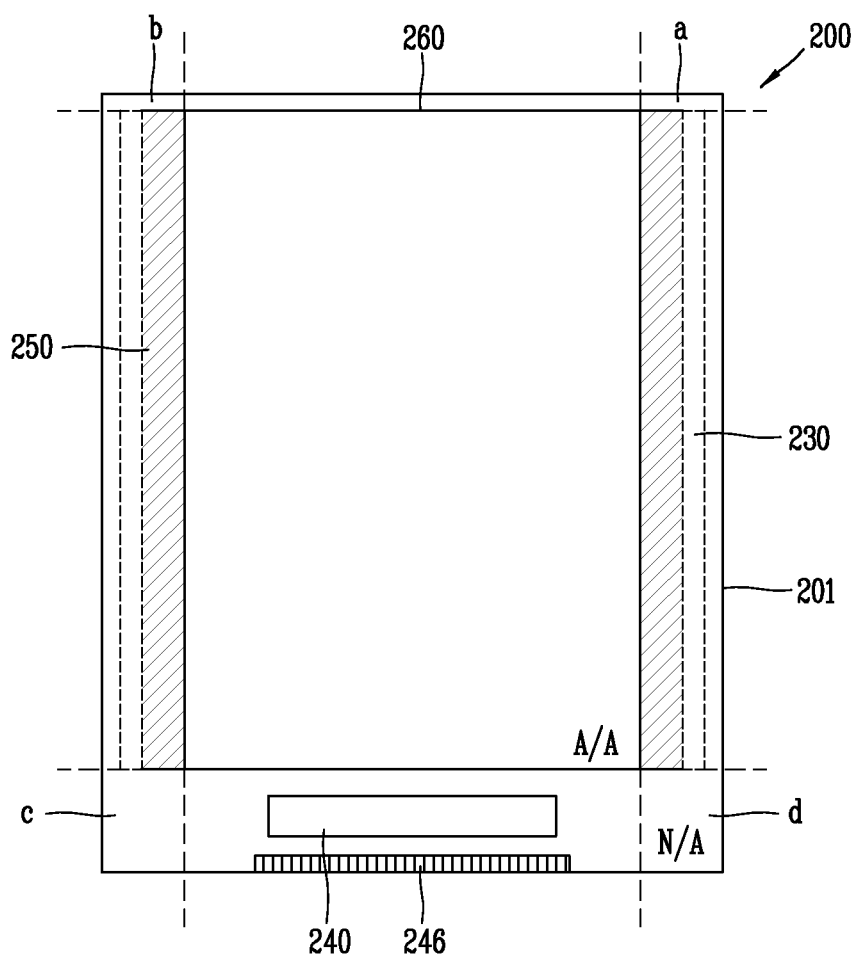
FIG. 6A is a view for explaining a method of processing a flexible display panel according to another embodiment of the present invention.
Figure 6B:
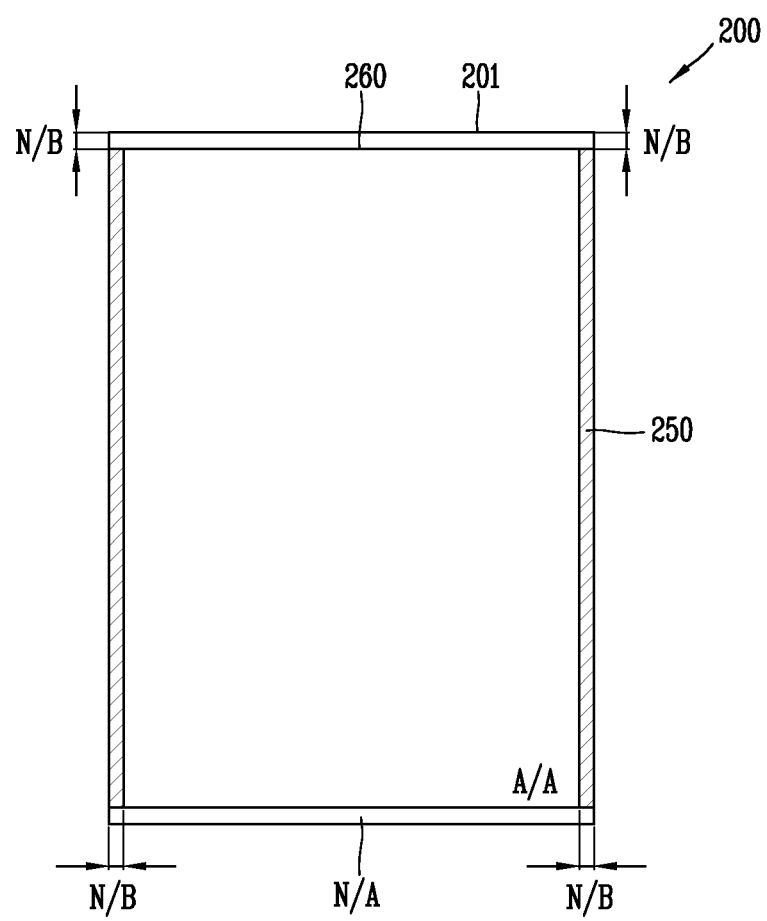
FIG. 6B is a view illustrating a display device structure subsequent to the bending of the processed flexible display panel according to an embodiment of the present invention.

FIG. 6A is a view for explaining a method of processing a flexible display panel according to another embodiment of the present invention, and FIG. 6B is a view illustrating a display device structure subsequent to the bending of the processed flexible display panel according to an embodiment of the present invention.

Referring to FIG. 6A, a flexible display device 200 according to the present invention is defined with an active area (A/A) in which an actual image is implemented on a substrate 201 and a non-active area (N/A) surrounding the active area (A/A), and a pixel area defined by a plurality of gate lines and data lines is formed in the active area (A/A), and each pixel area is formed with a thin film transistor.

Furthermore, two gate driving circuits 230 connected to gate lines are embedded therein in a GIP structure at the left and right side ends of the non-active area (N/A) of the flexible display panel 200. A data driving circuit 240 is electrically connected to a substrate pad 246 formed at one side end of the display panel 200. Furthermore, a polarizing film 260 for compensating the optical characteristics of the display panel 200 is adhered onto a front surface of the active area (A/A). In particular, an auxiliary line and a protective layer 250 thereon are formed between the active area (A/A) and the gate driving circuit 230.

When at least one portion of each side end is bent to implement a narrow bezel for the flexible display panel 200 with the foregoing structure, there is a limit in that it is difficult to bend the left and right side ends thereof due to an interference of the folded portion when the top and bottom side ends thereof are bent, and also difficult to bend the top and bottom side ends thereof when the left and right side ends thereof are bent.

In order to address these issues, according to another embodiment of the present invention, each corner region (a-d) illustrated in FIG. 6A is cut to minimize a mutual interference during the bending of four side ends. In other words, each corner region (a-d) is removed through a predetermined chamfering process prior to bending the flexible display panel 200, and then the top, bottom, left and right side ends of the flexible display panel 200 are bent to implement a narrow bezel (N/B) for all side ends thereof.

Here, though not shown in the drawing, a conventional layer structure is omitted between the active area (A/A) and the data driving circuit 240 to apply a structure forming an auxiliary line and a protective layer thereon, thereby minimizing the damage of the signal line and layer structure due to bending between the active area (A/A) and the data driving circuit 240.

Although many subject matters have been specifically disclosed in the foregoing description, they should be construed as an illustration of preferred embodiments rather than a limitation to the scope of invention. Consequently, the invention should not be determined by the embodiments disclosed herein but should be determined by the claims and the equivalents thereof.

What is claimed is:

1. A narrow bezel display apparatus using a folded substrate, comprising:
   an active area provided with a plurality of pixels having a multi-layer structure, wherein the multi-layer structure includes an interlayer insulating layer and a planarization layer;
   a non-active area configured to surround the active area, the non-active area including a gate driving circuit having the multi-layer structure and a bending area;
   a substrate defined with the bending area formed between the gate driving circuit and the active area, and at least one lateral surface which is warped in a rear surface direction thereof; and
   a supporting film adhered to a lower portion of the substrate,
   wherein the bending area includes:
   an auxiliary line formed with one layer for electrically connecting the gate driving circuit to the pixels, and
   a protective layer disposed only in the bending area between the active area and the gate driving circuit, the protective layer being disposed directly on the auxiliary line to protect the auxiliary line from moisture and damage due to a bending of the bending area,
   wherein the supporting film is disposed only in an area corresponding to the active area.

2. The narrow bezel display apparatus of claim 1, wherein at least one of the pixels comprises:
   a gate line;
   a data line crossed with the gate line; and
   a thin film transistor electrically connected to at least one of the gate line and data line.

3. The narrow bezel display apparatus of claim 2, wherein the auxiliary line is formed of the same metal as that of either one of the gate line and data line.

4. The narrow bezel display apparatus of claim 2, wherein the auxiliary line is made of copper (Cu) or copper alloy.

5. The narrow bezel display apparatus of claim 1, wherein the protective layer has the same material as that of the substrate.

6. The narrow bezel display apparatus of claim 1, wherein the protective layer is formed with the same thickness as that of the substrate.

7. The narrow bezel display apparatus of claim 1, wherein the supporting film includes a PET film.

8. The narrow bezel display apparatus of claim 1, wherein each corner end of the substrate is cut such that four side ends thereof are all warped.

9. A narrow bezel display apparatus using a folded substrate, comprising:
- a substrate defined with an active area and a non-active area comprising a gate-in-panel (GIP) area and a bending area, the bending area being warped in a rear surface direction thereof;
- a supporting film adhered to a lower portion of the substrate;
- a driving element layer formed on the active area and GIP area, respectively, to comprise a thin film transistor connected to a gate line and a data line;
- an auxiliary line formed on the bending area to be electrically connected to the driving element layer;
- a protective layer disposed only in the bending area between the active area and the GIP area, the protective layer being disposed directly on the auxiliary line to protect the auxiliary line from moisture and damage due to a bending of the bending area;
- a light-emitting element layer formed to be divided into each pixel on the driving element layer;
- a first passivation layer formed on the light-emitting element layer;
- an organic layer formed on the first passivation layer; and
- a second passivation layer formed on the first passivation layer of the active area, to an upper portion of which a protective film is adhered by an adhesive,
- wherein the active area includes a plurality of pixels having a multi-layer structure, and the multi-layer structure includes an interlayer insulating layer, and a planarization layer, and
- wherein the supporting film is disposed only in an area corresponding to the active area.

10. The narrow bezel display apparatus of claim 9, wherein the auxiliary line is formed of the same metal as that of either one of the gate line and data line.

11. The narrow bezel display apparatus of claim 9, wherein the auxiliary line is made of copper (Cu) or copper alloy.

12. The narrow bezel display apparatus of claim 9, wherein the protective layer has the same material as that of the substrate.

13. The narrow bezel display apparatus of claim 9, wherein the protective layer is formed with the same thickness as that of the substrate.

14. The narrow bezel display apparatus of claim 9, wherein the supporting film includes a PET film.

15. The narrow bezel display apparatus of claim 9, wherein each corner end of the substrate is cut such that four side ends thereof are all warped.

* * * * *